US010650895B2

(12) United States Patent
Lee

(10) Patent No.: US 10,650,895 B2
(45) Date of Patent: May 12, 2020

(54) MEMORY DEVICES WITH DISTRIBUTED BLOCK SELECT FOR A VERTICAL STRING DRIVER TILE ARCHITECTURE

(71) Applicant: Micron Technology, Inc., Boise, ID (US)

(72) Inventor: Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/446,234

(22) Filed: Jun. 19, 2019

(65) Prior Publication Data

US 2019/0304542 A1 Oct. 3, 2019

Related U.S. Application Data

(63) Continuation of application No. 15/816,484, filed on Nov. 17, 2017, now Pat. No. 10,453,533.

(51) Int. Cl.
| | |
|---|---|
| *G11C 16/08* | (2006.01) |
| *G11C 16/04* | (2006.01) |
| *G11C 5/02* | (2006.01) |
| *G11C 8/08* | (2006.01) |
| *G11C 8/12* | (2006.01) |

(52) U.S. Cl.
CPC .............. *G11C 16/08* (2013.01); *G11C 5/025* (2013.01); *G11C 8/08* (2013.01); *G11C 8/12* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 5,721,498 A | 2/1998 | Mason et al. | |
| 6,003,148 A | 12/1999 | Yamauchi et al. | |
| 6,249,475 B1 | 6/2001 | Atwell et al. | |
| 6,727,726 B1 | 4/2004 | Plants | |
| 8,619,493 B2 | 12/2013 | Kim | |
| 9,070,461 B2 | 6/2015 | Kim | |
| 9,236,127 B2 | 1/2016 | Rhie | |
| 9,318,199 B2 | 4/2016 | Abraham et al. | |
| 9,711,224 B2 | 7/2017 | Tanzawa | |
| 9,721,960 B2 | 8/2017 | Tanzawa | |
| 2012/0113721 A1* | 5/2012 | Kim ..................... | G11C 7/1045 365/185.12 |
| 2012/0314468 A1 | 12/2012 | Siau et al. | |

* cited by examiner

*Primary Examiner* — James G Norman
(74) *Attorney, Agent, or Firm* — TraskBritt

(57) ABSTRACT

Memory device having a tile architecture are disclosed. The memory device may include a first plane having multiple pairs of tiles, wherein at least some of the pairs of tiles of the first plane include a distributed block select circuit and page buffer circuitry. Another memory device may include a memory array, and a CMOS under array region. At least some tile regions may include portions of a total amount of block select circuitry distributed throughout the CUA region, vertical string drivers located outside of the memory array, and page buffer circuitry coupled with the memory array. Another memory device may include a first tile pair including a first tile, a second tile, a first vertical string driver therebetween, a first page buffer region that is greater than 50% of area for the first tile pair, and a first portion of a distributed block select circuitry.

20 Claims, 8 Drawing Sheets

MEMORY DEVICES WITH DISTRIBUTED BLOCK SELECT FOR A VERTICAL STRING DRIVER TILE ARCHITECTURE

CROSS-REFERENCE TO RELATED APPLICATION

This application is a continuation of U.S. patent application Ser. No. 15/816,484, filed Nov. 17, 2017, now U.S. Pat. No. 10,453,533, issued Oct. 22, 2019, the disclosure of which is hereby incorporated herein in its entirety by this reference.

TECHNICAL FIELD

The present disclosure, in various embodiments, relates generally to the field of memory device architectures. More particularly, this disclosure relates to the design and fabrication of memory devices having a tile architecture with distributed block select circuitry.

BACKGROUND

A memory block of a memory device, such as is used in NAND or NOR memory, may comprise a group of strings of memory cells that share the same set of access lines. The memory block may be grouped into a one or more pages (also referred to as "tiles"), and each page may comprise memory cells corresponding to at least a portion of a respective tier of each of the group of strings.

FIG. 1 is a simplified schematic diagram of a conventional architecture for a portion of a memory device including a tile group 100 including a first tile 105A and a second tile 105B. In this conventional architecture, the first tile 105A and the second tile 105B are offset from each other in the Y direction with vertical string driver circuitry 125 therebetween. A portion of the tile group 100 shown in FIG. 1 is part of the CMOS under array (CUA) space located under a memory array. Thus, the tile groups 105A, 105B are coupled to a memory array, which is not shown so as not to obscure the figure.

Each tile 105A, 105B includes block select circuitry 120 coupled to the vertical string driver circuitry 125 through block select lines 122, which in turn couple to access lines (e.g., word lines) coupled to the memory array. The block select lines 122 coupling the block select circuitry 120 and the vertical string driver circuitry 125 are shown as a single line for simplicity, however, it should be understood that the block select lines 122 include multiple lines but that a single line is shown for simplicity. Each tile 105A, 105B may further include available space for additional circuitry 130 such as periphery circuitry and/or other supporting circuitry (e.g., charge pumps, controllers, etc.) for the memory array that may be beneficial to include within the CUA space. In the conventional architecture layout, approximately half (50%) of the space is occupied by the page buffer 110, in part, because of the configuration of the block select circuitry 120. As a result, the flexibility in the configuration of the page buffer 110 may be limited. The block select circuitry 120 serves the tile group 100 and is split between the first tile 105A and the second tile 105B but on opposite ends of the vertical string driver circuitry 125 in order to couple to different portions thereof.

FIG. 2 is a simplified schematic diagram of a conventional architecture for a tile group 200 including multiple planes 108A, 108B having multiple tile groups (e.g., 105A & 105B). In particular, the first plane 108A includes tiles 105A-105H and the second plane 108B includes tiles 105I-105P. In this conventional architecture, the tile group shown in FIG. 1 is replicated to form the planes 108A, 108B. As with FIG. 1, each tile group includes block select circuitry 120 split between the two tiles of the tile group. As a result, each tile 105A-105P may have a page buffer 110 that occupies approximately 50% of the tile space, and the placement of any additional circuitry 130 may be fixed to be the remaining area on the other half of the tile that is not being occupied by the block select circuitry 120.

FIG. 3 is a simplified schematic diagram 300 of a conventional architecture for a tile group including multiple planes 108A, 108B having multiple tile groups (e.g., tiles 105A, 105B). The layout of page buffers 110 may be similar to that of FIG. 2; however, the block select circuitry 120 that is part of the first tile group (e.g., tiles 105A, 105B) may include block select lines 122 that extend to the other vertical string driver circuitry 125 of its respective plane 108A, 108B. For example, the portion of the block select circuitry 120 located within the first tile 105A may be coupled to the vertical string drivers associated with tile pairs 105C/105D, 105E, 105F, etc. As a result, the block select circuitry 120 may provide global support for each tile in its plane. While doing so may free up space for additional circuitry 130 by reducing the block select circuitry 120, the page buffer 110 may still occupy approximately 50% of the available tile space as a result of the configuration of the global block select circuitry 120.

BRIEF DESCRIPTION OF THE DRAWINGS

The illustrations presented herein are not meant to be actual views of any particular component, structure, device, or system, but are merely representations that are employed to describe embodiments of the present disclosure.

DETAILED DESCRIPTION

Figure 1:
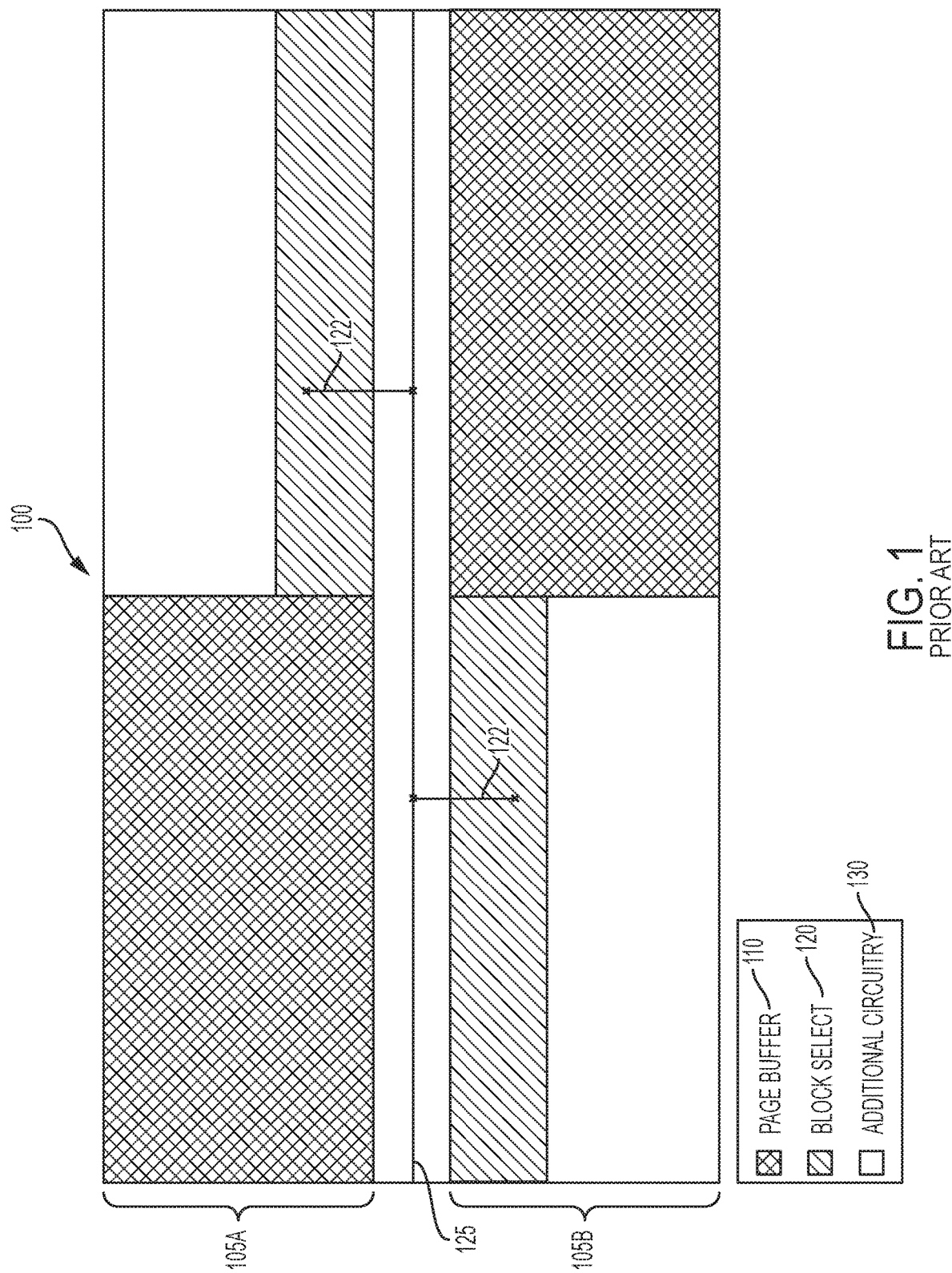
FIG. 1 is a simplified schematic diagram of a conventional architecture for a portion of a memory device including a tile group.
Figure 2:
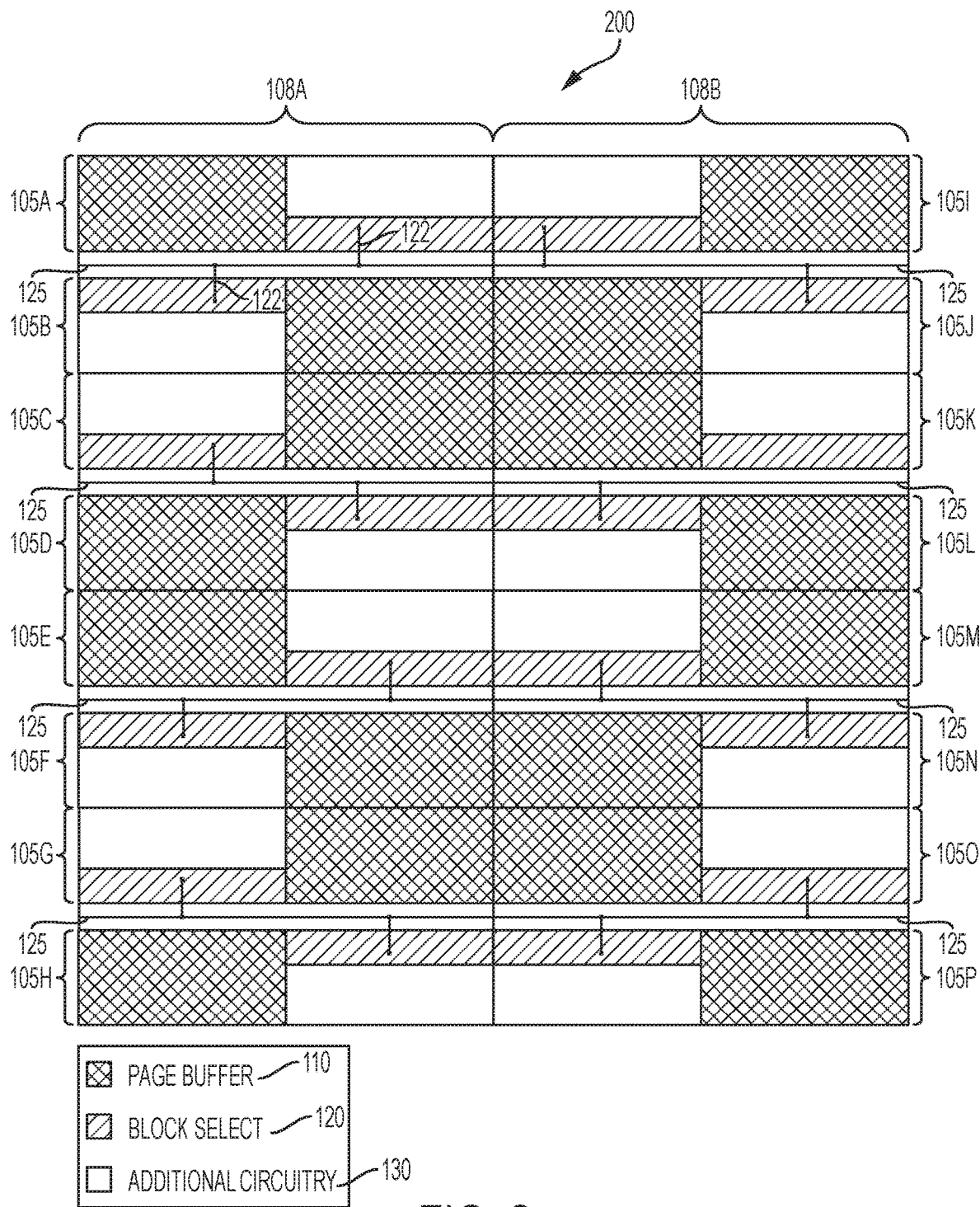
FIGS. 2 and 3 are simplified schematic diagram of various conventional architectures for a tile group including multiple planes having multiple tile groups.
Figure 3:
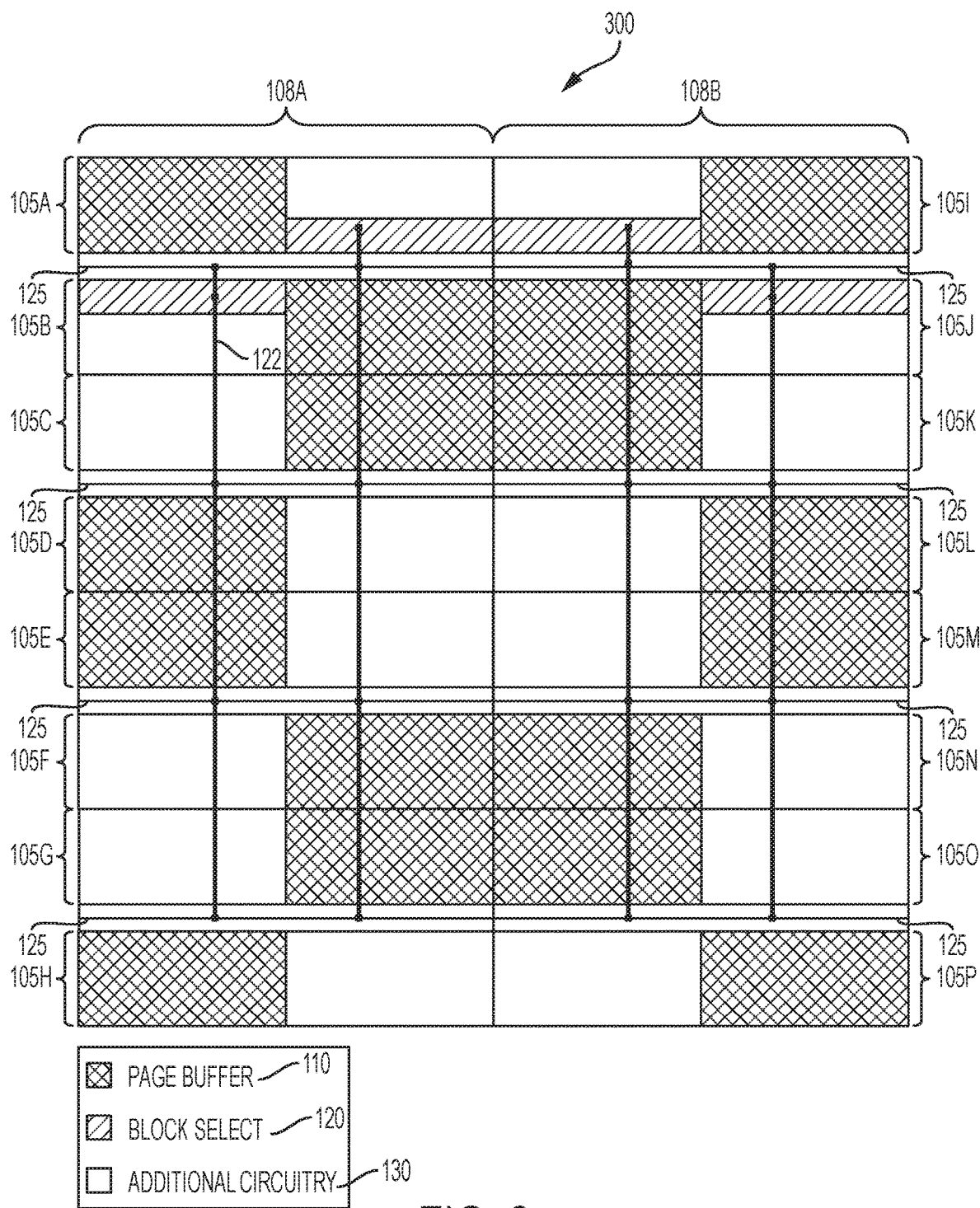

Memory devices, memory structures, memory cells, arrays including such memory cells, and other semiconductor devices including such arrays, systems including such arrays, and methods for fabricating and using such memory structures are also disclosed. Embodiments of the disclosure include a variety of different memory cells (e.g., volatile memory, non-volatile memory) and/or transistor configurations. Non-limiting examples include random-access memory (RAM), read only memory (ROM), dynamic random access memory (DRAM), synchronous dynamic random access memory (SDRAM), flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), etc.

Some memory devices include memory arrays having memory cells can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. Block select devices can be used to select particular blocks of memory cells of a 3D memory array. Although various embodiments discussed herein use examples relating to a single-bit memory storage concept for ease in understanding, the inventive subject matter can be applied to numerous multiple-bit schemes as well. For example, each of the memory cells can be programmed to a different one of at least two data states to represent, for example, a value of a fractional bit, the value of a single bit or the value of multiple bits such as two, three, four, or more numbers of bits. For example, memory cells can be programmed to one of two data states to represent a binary value of "0" or "1" in a single bit. Such a cell is sometimes called a single-level cell (SLC). A cell that can be programmed to one of more than two data states is sometimes referred to as a multi-level cell (MLC).

As used herein, spatially relative terms, such as "beneath," "below," "lower," "bottom," "above," "upper," "top," "front," "rear," "left." "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly. In addition, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the singular forms "a," "an," and "the" are intended to include the plural forms as well, unless the context clearly indicates otherwise. In addition, it should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

As used herein, "and/or" includes any and all combinations of one or more of the associated listed items.

As used herein, the term "configured" refers to a size, shape, material composition, and arrangement of one or more of at least one structure and at least one apparatus facilitating operation of one or more of the structure and the apparatus in a pre-determined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

In some embodiments, a memory device is disclosed having a tile architecture. The memory device comprises a first plane having multiple pairs of tiles, wherein at least some of the pairs of tiles of the first plane include a distributed block select circuit and page buffer circuitry.

In some embodiments, a memory device having a tile architecture is disclosed. The memory device comprises a first tile pair including a first tile, a second tile, a first vertical string driver therebetween, a first page buffer region that is greater than 50% of area for the first tile pair, and a first portion of a distributed block select circuitry; and a second tile pair including a third tile, a fourth tile, and a second vertical string driver therebetween, a second page buffer region that is greater than 50% of area for the second tile pair, and a second portion of a distributed block select circuitry. The first portion and the second portion of the distributed block select circuitry are each coupled to the first vertical string driver and the second vertical string driver.

Figure 4:
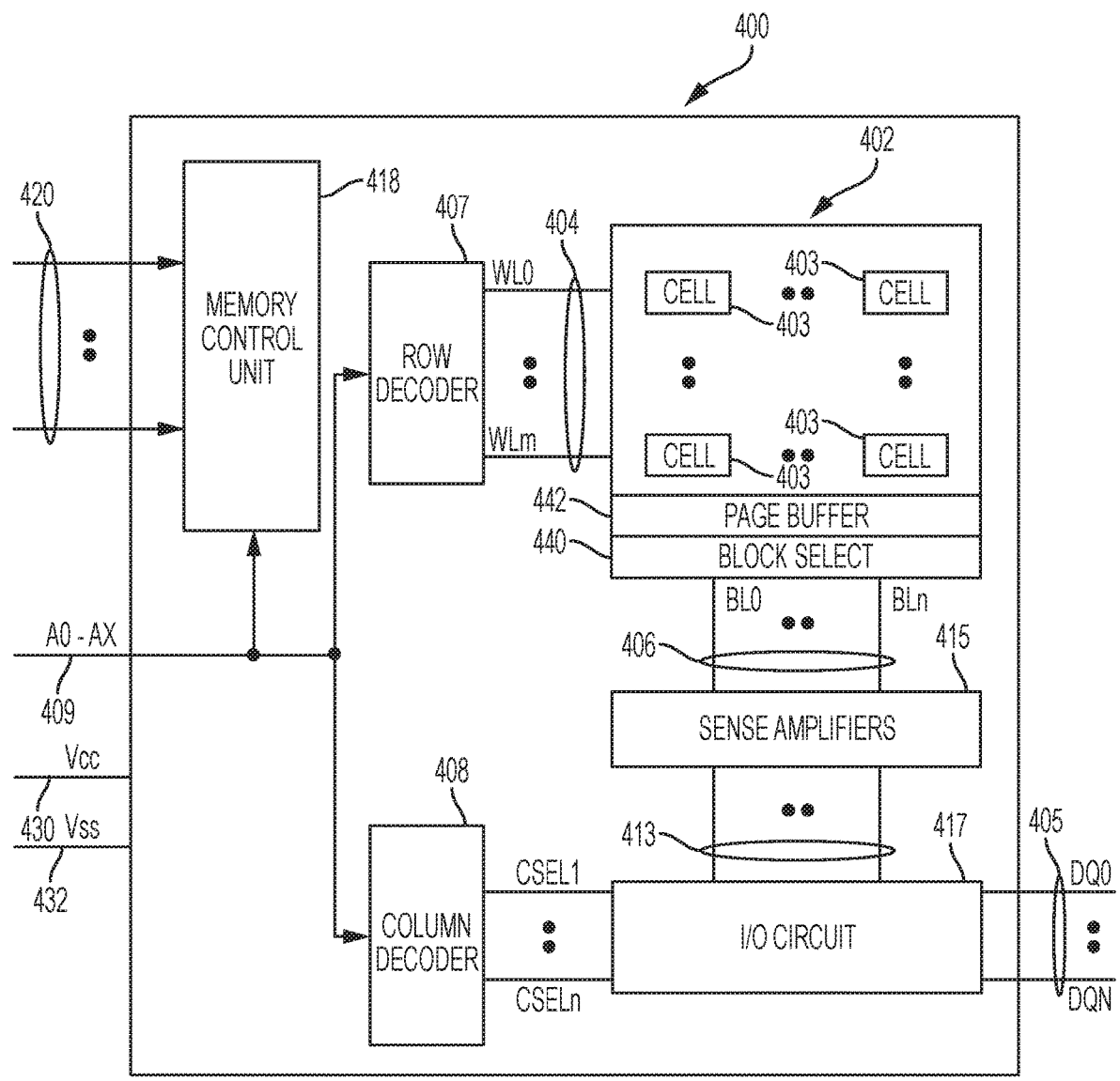
FIG. 4 is a block diagram of a memory device according to embodiments of the disclosure.

FIG. 4 is a block diagram of a memory device 400 according to embodiments of the disclosure. The memory device 400 includes a memory array 402 having a plurality of memory cells 403 according to an embodiment. The memory cells 403 may be arranged in rows and columns along with access lines 404 (e.g., word lines to conduct signals WL0 through WLm) and data lines 406 (e.g., bit lines to conduct signals BL0 through BLn). Each of the memory cells 403 can include a memory element having material, at least a portion of which can be programmed to a desired data state (e.g., by storing a corresponding amount of charge on a charge storage element, such as a floating gate or charge trap, by being programmed to a corresponding resistance value). Different data states thus represent different values of data programmed into each of the memory cells 403. In some embodiments, the memory device 400 may comprise non-volatile memory cells configured to retain data stored therein when power (e.g., Vcc 430, Vss 432, or both) is disconnected from the memory device 400 and/or volatile memory cells requiring periodic refresh to retain data storage. In addition, the memory cells 403 may be configured as single-level cells (SLCs) or multi-level cells (MLCs). The memory device 400 may be arranged in a three-dimensional configuration including multiple planes of memory cells divided into tiles as will be discussed below.

The memory device 400 may be configured to use the access lines 404 and the data lines 406 to perform operations (e.g., read, write, erase, etc.) on the memory cells 403. The memory device 400 further includes a row decoder 407 and a column decoder 408 configured to decode address signals A0 through AX on address lines 409 to determine which ones of the memory cells 403 are to be accessed. Sense circuitry, such as a sense amplifier circuit 415, is configured to determine the values of data read from the memory cells 403 via the data lines 406, as well as determine the values of data to be written to the memory cells 403 the data lines 406.

The memory device 400 further includes an input/output (I/O) circuit 417 configured to transfer data between the memory array 402 and I/O lines 405. Signals DQ0 through DQN on the I/O lines 405 represent values of data read from or to be written into the memory cells 403. The memory device 400 may also include a memory control unit 418 configured to control memory operations to be performed on the memory cells 403 responsive to control signals received on control lines 420. For example, control signals may include one or more clock signals and other signals to indicate which operation (e.g., a read operation, a write operation, an erase operation, etc.) the memory device 400 should perform. Other devices external to the memory device 400 (e.g., a processor and/or an external memory controller, not shown in FIG. 4) may be coupled to the memory device 400 to communicate with the memory device 400 through the I/O lines 405, the address lines 409, and/or the control lines 420 to cause the memory device 400 to perform a corresponding memory operation on the desired memory cell(s) 403.

The memory device 400 can receive a supply voltage, including supply voltage signals Vcc and Vss, on a first supply line 430 and a second supply line 432, respectively. Supply voltage signal Vss may, for example, be at a ground potential (e.g., having a value of approximately zero volts). Supply voltage signal Vcc can include an external voltage supplied to the memory device 400 from an external power source such as a battery or alternating-current to direct-current (AC-DC) converter circuitry (not shown in FIG. 4).

The memory device 400 further includes a select circuit 440 and a page buffer 442. The select circuit 440 may be configured to respond, via the I/O circuit 417, to chip select signals CSEL1 through CSELn to select signals on data lines 406, 413 representing the values of data to be read from or to be programmed into the memory cells 403. The column decoder 408 selectively activates the chip select signals CSEL1 through CSELn based on the A0 through AX address signals on the address lines 409. The select circuit 440 selects the signals on the data lines 406 and the data lines 413 to provide communication between the memory array 402 and the I/O circuit 417 during read and programming operations. The page buffer 442 may store data received from an external device (e.g., a host), before the data is written to a relevant portion of the memory array 402, or store data read from the memory array 402 before the data is transmitted to the external device.

Embodiments of the disclosure include the block select circuitry 440 and the page buffer 442 configured according to a tile architecture in which the block select circuitry 440 used to control the vertical string drivers is distributed across multiple tiles in a single plane as will be discussed below. As a result, the architecture allows for more flexible placement and sizing of the page buffer 442.

Figure 5:
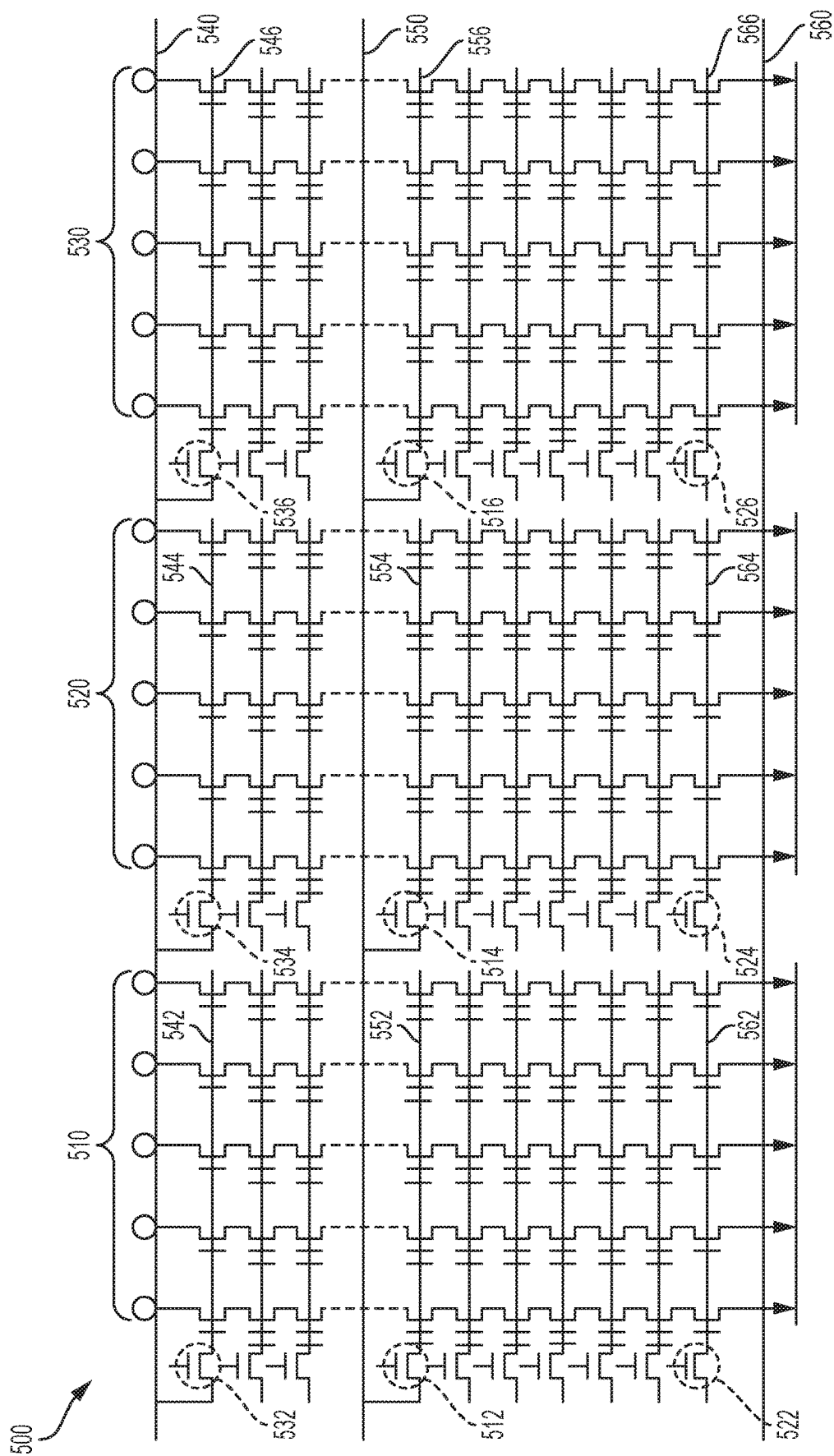
FIG. 5 is a schematic diagram of a portion of a memory block of a memory device.

FIG. 5 is a schematic diagram of a portion of a memory block 500 of a memory device. This portion may be a plane (also referred to as a "tier") of the memory block 500. In this embodiment, fifteen strings of memory cells are shown for the memory block 500. The strings of the memory block 500 may be split into subsets 510, 520, 530 (e.g., also referred to as a "partial block," "tile," or "page") of strings.

In various embodiments, each tile 510, 520, 530 may be independently selectable (e.g., biased) from other partial tiles. In various embodiments, the memory block 500 (or any other memory block in the 3D NAND memory device) may be electrically split into smaller units, including the partial pages. For example, in one embodiment, a global drain select gate (SGD) line 540 that may be coupled to the SGDs of the strings may be coupled to a plurality (e.g., three) of local SGD lines 542, 544, 546 with each local SGD line corresponding to a respective partial tile 510, 520, 530 via a corresponding SGD driver 532, 534, 536. Each of the local SGD drivers 532, 534, 536 may concurrently couple or cut off the SGDs of the strings of a corresponding partial block (e.g., the column) independently of those of other tiles 510, 520, 530.

Similarly, a global SGS line 560 that may be coupled to the SGSs of the strings may be coupled to a plurality (e.g., three) of local SGS lines 562, 564, 566 with each local SGS line corresponding to the respective tile 510, 520, 530 via a corresponding one of a plurality (e.g., three) of local SGS drivers 522, 524, 526. Each of the local SGS drivers 522, 524, 526 may concurrently couple or cut off the SGSs of the strings of a corresponding partial block (e.g., the column) independently of those of other partial tiles 510, 520, 530.

In various embodiments, as shown in FIG. 5, for a respective tier of the memory block 500, a global access line 550 (e.g., global word line) may be coupled to the memory cells corresponding to the respective tier of each of the strings. The global access line 550 may be coupled to local access lines 552, 554, 556 (e.g., local wordlines) via a corresponding local string driver 512, 514 and 516. Each of the local string drivers 512, 514 and 516 may concurrently couple or cut off the memory cells corresponding to the respective tile 510, 520, 530 independently of those of other tiles 510, 520, 530. Although the schematic diagram of FIG. 5 shows the various elements of the memory block 500 in a two-dimensional view, it should be recognized that certain elements (e.g., local string drivers) may be configured as vertical devices in the actual architecture.

Figure 6:
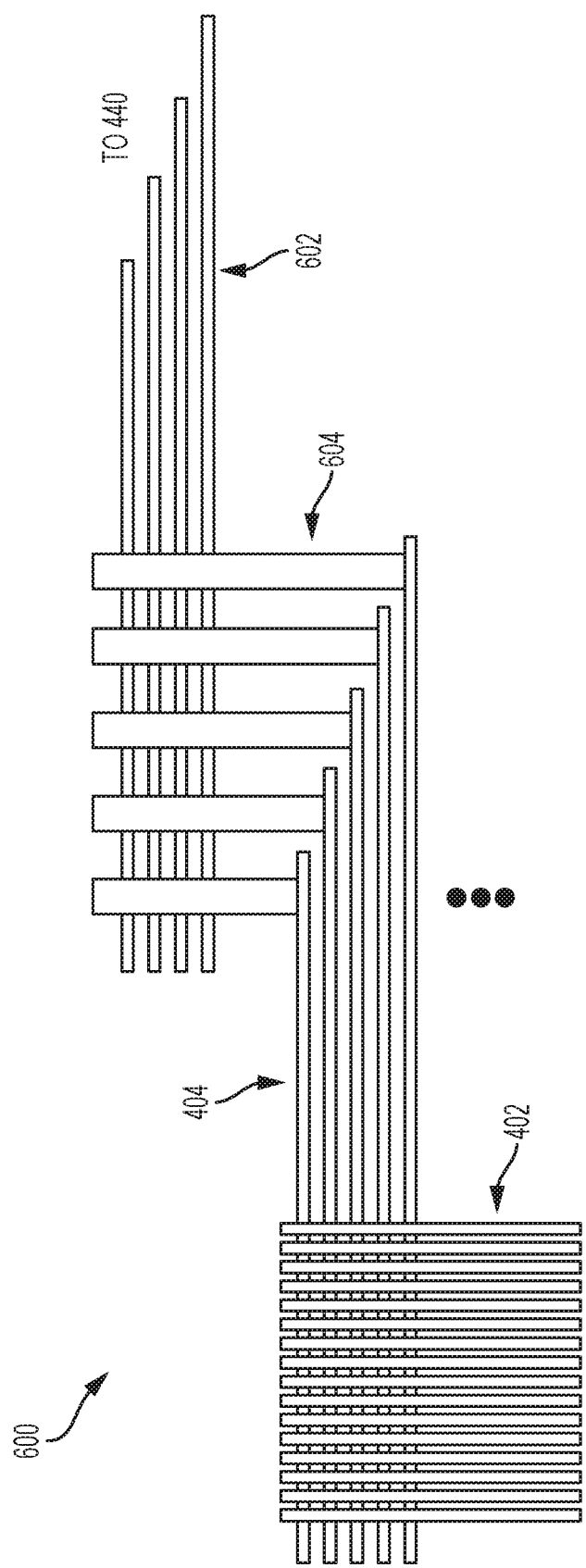
FIG. 6 is a simplified block diagram of a portion of a memory block according to an embodiment of the disclosure.

FIG. 6 is a simplified block diagram of a portion of a memory block 600 according to an embodiment of the disclosure. The memory block 600 includes vertical string drivers 604 coupled between block select lines 602 and access lines 404. The block select lines 602 may be coupled to block select circuitry 440 (FIG. 4), and the access lines 404 (e.g., wordlines) may be coupled to the memory array 402. The vertical string driver circuitry 604 may also be coupled with a global access line (not shown) to select which memory block is connected to the global access line.

Figure 7:
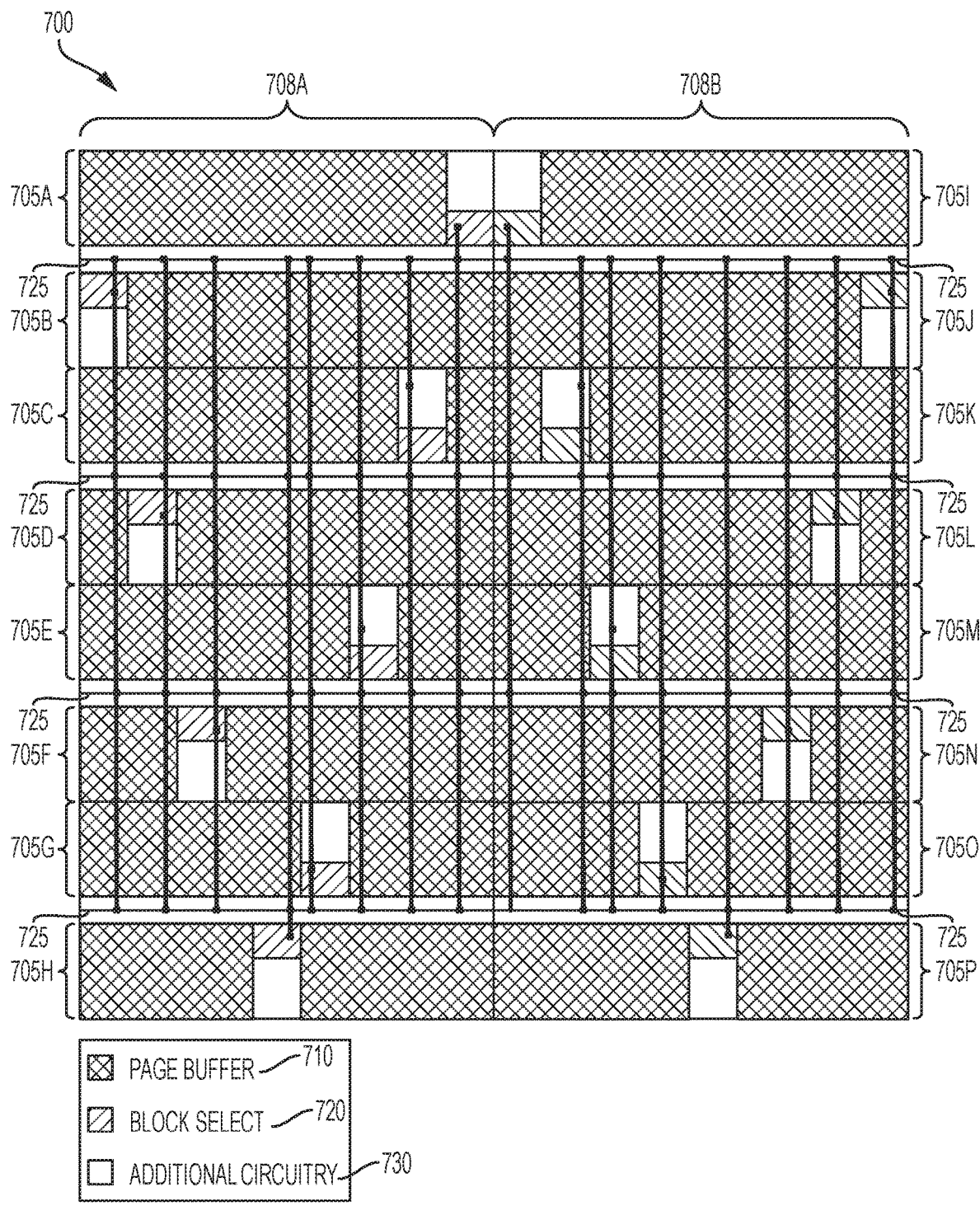
FIGS. 7 and 8 are simplified schematic diagram of various architectures for a tile group including multiple planes having multiple tile groups with distributed block select circuitry according to embodiments of the disclosure.

FIG. 7 is a simplified schematic diagram of an architecture for a portion of a memory block 700 including multiple planes 708A, 708B having multiple tile groups with distributed block select circuitry 720 according to an embodiment of the disclosure. Although two planes 708A, 708A are shown, additional planes are also contemplated. Similarly, although sixteen tiles are shown, any number of tiles or tile groups per plane are also contemplated.

In some embodiments, the block select circuitry 720 may be distributed across all tiles in the respective plane 708A, 708B. Thus, with the example of FIG. 7, each tile 705A-705H of the first plane 708A may include a portion of the block select circuitry 720 supporting the first plane 708A. Likewise, each tile 705I-705P of the second plane 708B may include a portion of the block select circuitry 720 supporting the second plane 708B. The distributed block select circuitry 720 may be coupled to the vertical string driver circuitry 725 associated with a tile group that includes a portion of the distributed block select circuitry 720. For example, in FIG. 7 each portion of the block select circuitry 720 in the first plane 708A is coupled to the vertical string driver circuitry 725 associated with the first tile group (tiles 705A, 705B), the vertical string driver circuitry 725 associated with the second tile group (tiles 705C, 705D), the vertical string driver circuitry 725 associated with the third tile group (tiles 705E, 705F), and the vertical string driver circuitry 725 associated with the fourth tile group (tiles 705G, 705H). Likewise, each portion of the block select circuitry 720 in the second plane 708B is coupled to the vertical string driver circuitry 725 associated with the fifth tile group (tiles 705I, 705J), the vertical string driver circuitry 725 associated with the sixth tile group (tiles 705K, 705L), the vertical string driver circuitry 725 associated with the seventh tile group (tiles 705M, 705N), and the vertical string driver circuitry 725 associated with the eighth tile group (tiles 705O, 705P).

The block select circuitry 720 within a respective plane 708A, 708B may be offset relative to each other such that the available vertical string driver circuitry 725 may be efficiently utilized. The distribution may be performed evenly such that each tile 705A-705H of the first plane 708A includes ⅛ of the block select circuitry 720 located within the first plane 708A. Likewise, each tile 705I-705P of the second plane 708B may also include ⅛ of the block select circuitry 720 located within the second plane 708B. Of course, in some embodiments, the block select circuitry 720 within a respective plane 708A, 708B may be distributed throughout the tiles 705A-705P unevenly. For example, instead of the block select circuitry 720 for each tile 705A-708H of the first plane 708A being distributed in ⅛ portions, the first tile 705A may include a block select circuitry of 3/16 size and the third tile 705C may include a block select circuitry of 1/16 size. Other sizes and combinations are also contemplated.

The remaining CUA space may be filled with additional page buffer 710 as desired (e.g., greater than 50% of the space within one or more of the tiles), which may improve the operation of the memory device by having more buffering capabilities available and reducing data bottlenecks in comparison to conventional architectures. In some embodiments, the page buffer 710 may occupy a percentage of the available space according to PB $\%_{MAX}=1-1/$(tiles per plane). The open space within each tile adjacent to the block select circuitry 720 circuitry may be filled with additional circuitry 730 as discussed above.

In some embodiments, a memory device having a tile architecture is disclosed. The memory device comprises a memory array and a CUA region. The CUA region includes at least some tile regions including portions of a total amount of block select circuitry distributed throughout the CUA region, vertical string drivers located outside of the memory array, and coupled with multiple portions of the block select circuitry located within different tile regions, and page buffer circuitry coupled with the memory array.

Figure 8:
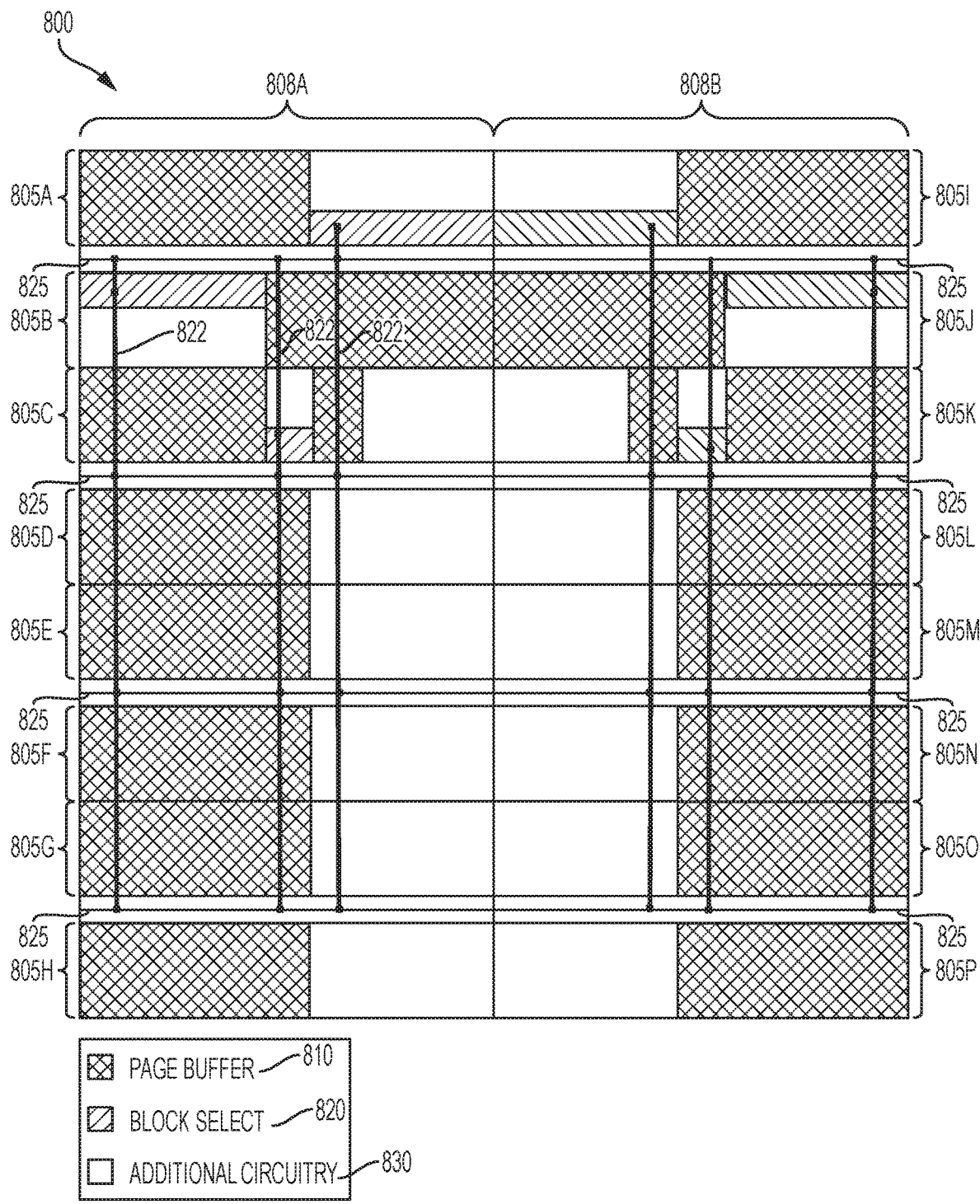

FIG. 8 is a simplified schematic diagram of an architecture for a portion of a memory block 800 including multiple planes 808A, 808B having multiple tile groups with distributed block select circuitry 820 according to an embodiment of the disclosure. The first plane 808A includes tiles 805A-805H, and the second plane includes tiles 805I-805P. As shown in FIG. 8, the block select circuitry 820 may be distributed to some, but not all, tile groups within the respective planes. For example, the block select circuitry 820 within the first plane 808A may be distributed within tiles 805A, 805B, 805C, and the block select circuitry 820 within the second plane 808B may be distributed within tiles 805I, 805J, 805K. In addition, the block select circuitry 820 is shown to not be distributed equally among the different tiles. For example, the block select circuitry 820 for the first plane 808A may be distributed within tile 805A (approx. 43%), tile 805B (approx. 43%), tile 805C (approx. 14%), and the block select circuitry 820 within the second plane 808B may be distributed within tile 805I (e.g., approx. 43%), tile 805J (e.g., approx. 43%), and tile 805K (e.g., approx. 14%). Other percentages are also contemplated. As discussed above, block select lines 822 may couple the block select circuitry 820 with vertical string driver circuitry 825.

Rather than maximizing the capacity of page buffer 810 as in FIG. 7, more open space for additional circuitry 830 may be reserved by not forming the entirety of tiles 805D-805H, 805L-805P with the page buffer 810 circuitry. The page buffer 810 may be greater than 50% for tiles as desired by the designer. It is contemplated that some tiles may be formed with less than 50% page buffer 810, but the maximum percentage is not limited to 50% as with conventional architectures. This additional flexibility of placement may enable the designer to form the page buffer 810 in tiles 805D-805H, 805L-805P to the periphery of the planes 808A, 808B because such tiles may not include any block select circuitry. As a result, a relatively large contiguous region may exist in the middle of the memory block 800, which may be beneficial for certain components being formed as the additional circuitry 830 in the open space.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A memory device having a tile architecture, the memory device comprising:
    a first plane having multiple pairs of tiles, wherein at least some of the pairs of tiles of the first plane include a distributed block select circuit and page buffer circuitry, at least one portion of the distributed block select circuit within a first pair of tiles of the multiple pairs of tiles physically offset, in a first direction, from at least one other portion of the distributed block select circuit within a second pair of tiles of the multiple pairs of tiles, each pair of tiles of the multiple pair of tiles having an associated vertical string driver physically offset, in a second, different direction, from each of a first tile and a second tile of an associated pair of tiles.

2. The memory device of claim 1, wherein the block select circuit is distributed across all tiles in the first plane.

3. The memory device of claim 2, wherein the block select circuit is distributed evenly across all tiles in the first plane.

4. The memory device of claim 2, wherein the block select circuit is distributed unevenly across the tiles in the first plane.

5. The memory device of claim 1, wherein the block select circuit is distributed across only a subset of tiles in the first plane.

6. The memory device of claim 1, further comprising a second plane having multiple pairs of tiles.

7. The memory device of claim 1, further comprising a CMOS under array region including the first plane.

8. The memory device of claim 7, further comprising a memory array coupled with the CMOS under array region.

9. The memory device of claim 8, wherein the memory array is a three-dimensional memory array.

10. A memory device, comprising:
a number of pairs of tiles, each pair of tiles of the number of pairs of tiles including a first tile and a second tile, each of the first tile and the second tile including:
a portion of a distributed block select circuit for the number of pairs of tiles;
additional circuitry; and
a page buffer having an area greater than a combined area of the portion of the distributed block select circuit and the additional circuitry of the associated tile.

11. The memory device of claim 10, further comprising a number of vertical string driver circuits, each vertical string driver circuit positioned between the first tile and the second tile of an associated pair of tiles and coupled to the portion of the distributed block select circuit of the first tile and the portion of the distributed block select circuit of the second tile.

12. The memory device of claim 10, further comprising:
a number of additional pairs of tiles, each pair of tiles of the number of additional pairs of tiles including a third tile and a fourth tile, each of the third tile and the fourth tile including:
a portion of another distributed block select circuit for the number of additional pairs of tiles; and
an additional page buffer having an area greater than 50% of an area of the associated tile.

13. The memory device of claim 12, further comprising a number of additional vertical string driver circuits, each additional vertical string driver circuit of the additional vertical string driver circuits positioned between the third tile and the fourth tile of an associated additional pair of tiles and coupled to the portion of the distributed block select circuitry of the third tile and the portion of the distributed block select circuitry of the fourth tile.

14. The memory device of claim 10, wherein the additional circuitry comprises periphery circuitry, a charge pump, a controller, or any combination thereof.

15. A memory device, comprising:
a first tile pair including a first tile, a second tile, and a first vertical string driver offset from the first tile and the second tile in a first direction, the first tile including a first portion of a distributed block select circuitry and the second tile including a second portion of the distributed block select circuitry; and
a second tile pair including a third tile, a fourth tile, and a second vertical string driver offset from the third tile and the fourth tile in the first direction, the third tile including a third portion of the distributed block select circuitry and the fourth tile including a fourth portion of the distributed block select circuitry;
wherein each of the first portion of the distributed block select circuity, the second portion of the distributed block select circuity, the third portion of the distributed block select circuity, and the fourth portion of the distributed block select circuity are offset from every other portion of the distributed block select circuitry in a second, different direction.

16. The memory device of claim 15, wherein each of the first tile pair and the second tile pair further includes a buffer region that is greater than 50% of an area for the associated tile pair.

17. The memory device of claim 15, further comprising a memory array coupled to the distributed block select circuitry.

18. The memory device of claim 15, wherein the first tile pair and the second tile pair each include a space adjacent to the respective distributed block select circuitry that includes peripheral circuitry for a memory array.

19. The memory device of claim 15, further comprising additional tile pairs, wherein at least some of the additional tile pairs include portions of the distributed block select circuitry.

20. The memory device of claim 19, wherein at least some of the additional tile pairs do not include any portions of the distributed block select circuitry.

* * * * *

UNITED STATES PATENT AND TRADEMARK OFFICE
CERTIFICATE OF CORRECTION

PATENT NO. : 10,650,895 B2
APPLICATION NO. : 16/446234
DATED : May 12, 2020
INVENTOR(S) : Eric N. Lee Page 1 of 1

It is certified that error appears in the above-identified patent and that said Letters Patent is hereby corrected as shown below:

In the Specification
Column 3, Line 32, change ""left." "right,"" to --"left," "right,"--

Signed and Sealed this
Twenty-third Day of June, 2020

Andrei Iancu
*Director of the United States Patent and Trademark Office*